United States Patent
Najafi et al.

(10) Patent No.: US 12,307,352 B2
(45) Date of Patent: May 20, 2025

(54) METHOD AND ARCHITECTURE FOR ACCELERATING DETERMINISTIC STOCHASTIC COMPUTING USING RESIDUE NUMBER SYSTEM

(71) Applicant: University of Louisiana at Lafayette, Lafayette, LA (US)

(72) Inventors: Mohammadhassan Najafi, Lafayette, LA (US); Kamyar Givaki, Tehran (IR); Seyed Reza Hojabrossadati, Lafayette, LA (US); M. H. Gholamrezayi, Lafayette, LA (US); Ahmad Khonsari, Lafayette, LA (US); Saeid Gorgin, Lafayette, LA (US); Dara Rahmati, Lafayette, LA (US)

(73) Assignee: University of Louisiana at Lafayette, Lafayette, LA (US)

( * ) Notice: Subject to any disclaimer, the term of this patent is extended or adjusted under 35 U.S.C. 154(b) by 1056 days.

(21) Appl. No.: 17/166,378

(22) Filed: Feb. 3, 2021

(65) Prior Publication Data

US 2021/0241085 A1 Aug. 5, 2021

Related U.S. Application Data

(60) Provisional application No. 62/969,872, filed on Feb. 4, 2020.

(51) Int. Cl.
| | | |
|---|---|---|
| *G06N 3/063* | (2023.01) | |
| *G06F 1/3234* | (2019.01) | |
| *G06F 9/38* | (2018.01) | |
| *G06N 3/08* | (2023.01) | |
| *H03K 19/173* | (2006.01) | |

(52) U.S. Cl.
CPC ............ *G06N 3/063* (2013.01); *G06F 1/3234* (2013.01); *G06F 9/3877* (2013.01); *G06N 3/08* (2013.01); *H03K 19/1737* (2013.01)

(58) Field of Classification Search
CPC .......................... G06F 9/3877; H03K 19/1737
See application file for complete search history.

(56) References Cited

U.S. PATENT DOCUMENTS

| | | | | |
|---|---|---|---|---|
| 7,027,598 B1 * | 4/2006 | Stojancic | .............. | H04L 9/3249 |
| | | | | 708/502 |
| 2004/0205095 A1 * | 10/2004 | Gressel | ................... | H03K 3/84 |
| | | | | 708/253 |

* cited by examiner

*Primary Examiner* — Michael D. Yaary
(74) *Attorney, Agent, or Firm* — Kean Miller LLP; Jessica C. Engler; Russel O. Primeaux

(57) ABSTRACT

Inaccuracy of computations is an important challenge with the Stochastic Computing (SC) paradigm. Recently, deterministic approaches to SC are proposed to produce completely accurate results with SC circuits. Instead of random bit-streams, the computations are performed on structured deterministic bit-streams. However, current deterministic methods take a large number of clock cycles to produce correct result. This long processing time directly translates to very high energy consumption. This invention proposes a design methodology based on the Residue Number Systems (RNS) to mitigate the long processing time of the deterministic methods. Compared to the state-of-the-art deterministic methods of SC, the proposed approach delivers improvements in terms of processing time and energy consumption.

14 Claims, 4 Drawing Sheets

FIGURE 2

| Binary Precision | Moduli Set | Prior Deterministic [3], [4] (cycles) | Proposed Method (cycles) | Clock Cycles Reduction Ratio |
|---|---|---|---|---|
| 8-bits | 8,7,5 | $2^{16}$ | $2^{6}$ | $2^{10}$ |
| 16-bits | 16,15,13,11,7 | $2^{32}$ | $2^{8}$ | $2^{22}$ |
| 16-bits | 64,63,61 | $2^{32}$ | $2^{12}$ | $2^{20}$ |
| 24-bits | 32,31,29,27,25 | $2^{48}$ | $2^{10}$ | $2^{38}$ |
| 24-bits | 64,63,61,59,5 | $2^{48}$ | $2^{12}$ | $2^{36}$ |
| 24-bits | 512,511,509 | $2^{48}$ | $2^{18}$ | $2^{30}$ |
| 32-bits | 2048,2047,2045 | $2^{64}$ | $2^{22}$ | $2^{42}$ |

FIGURE 3

| Binary Bit-width | Modulus Bit-width | Prior Deterministic [3], [4] (cycles) | Proposed Method (cycles) | Clock Cycles Reduction Ratio |
|---|---|---|---|---|
| 8 | 3 | $2^{16}$ | $2^{6}$ | $2^{10}$ |
| 9 | 4 | $2^{18}$ | $2^{8}$ | $2^{10}$ |
| 10 | 4 | $2^{20}$ | $2^{8}$ | $2^{12}$ |
| 11 | 4 | $2^{22}$ | $2^{8}$ | $2^{14}$ |
| 12 | 5 | $2^{24}$ | $2^{10}$ | $2^{14}$ |
| 13 | 5 | $2^{26}$ | $2^{10}$ | $2^{16}$ |
| 14 | 5 | $2^{28}$ | $2^{10}$ | $2^{18}$ |
| 15 | 6 | $2^{30}$ | $2^{12}$ | $2^{18}$ |
| 16 | 6 | $2^{32}$ | $2^{12}$ | $2^{20}$ |
| 17 | 6 | $2^{34}$ | $2^{12}$ | $2^{22}$ |
| 18 | 7 | $2^{36}$ | $2^{14}$ | $2^{22}$ |
| 19 | 7 | $2^{38}$ | $2^{14}$ | $2^{24}$ |
| 20 | 7 | $2^{40}$ | $2^{14}$ | $2^{26}$ |

FIGURE 5

| # | $x$ ($2^m - 3$) | $y$ ($2^m - 1$) | $z$ ($2^m$) | Next State (Output) | Example ($m = 3, DR = 280$) |
|---|---|---|---|---|---|
| 0 | 0 | 0 | 0 | $S_{(c+R_0)\%DR}$ | $S_c$ |
| 1 | 0 | 0 | 1 | $S_{(c+R_1)\%DR}$ | $S_{(c+105)\%280}$ |
| 2 | 0 | 1 | 0 | $S_{(c+R_2)\%DR}$ | $S_{(c+120)\%280}$ |
| 3 | 0 | 1 | 1 | $S_{(c+R_3)\%DR}$ | $S_{(c+225)\%280}$ |
| 4 | 1 | 0 | 0 | $S_{(c+R_4)\%DR}$ | $S_{(c+56)\%280}$ |
| 5 | 1 | 0 | 1 | $S_{(c+R_5)\%DR}$ | $S_{(c+161)\%280}$ |
| 6 | 1 | 1 | 0 | $S_{(c+R_6)\%DR}$ | $S_{(c+176)\%280}$ |
| 7 | 1 | 1 | 1 | $S_{(c+R_7)\%DR}$ | $S_{(c+1)\%280}$ |

FIGURE 6

| Bit-Width | 8-bit | | | | | | | 12-bit | | | | | | |
|---|---|---|---|---|---|---|---|---|---|---|---|---|---|---|
| Design Approach | CP (ns) | Area ($\mu m^2$) | Power @ 100MHz (mW) | Power @ Max Freq. (mW) | EPC (pJ) | # of Cycles | Energy @ Max Freq. (pJ) | CP (ns) | Area ($\mu m^2$) | Power @ 100MHz (mW) | Power @ Max Freq. (mW) | EPC (pJ) | # of Cycles | Energy @ Max Freq. (pJ) |
| Deterministic SC | 1.08 | 957.58 | 0.07 | 0.60 | 0.64 | $2^{16}$ | 4.16E+4 | 1.21 | 1426.20 | 0.10 | 0.72 | 0.88 | $2^{24}$ | 1.46E+7 |
| Our proposed | 0.45 | 328.51 | 0.02 | 0.45 | 0.20 | $2^7$ | 1.29E+1 | 0.63 | 563.63 | 0.04 | 0.50 | 0.32 | $2^{10}$ | 3.22E+2 |
| RNS | 0.75 | 431.76 | 0.03 | 0.34 | 0.26 | 1 | 2.56E-1 | 0.95 | 1016.03 | 0.08 | 0.77 | 0.73 | 1 | 7.31E-1 |
| Binary | 1.54 | 1068.13 | 0.08 | 0.48 | 0.74 | 1 | 7.39E-1 | 2.38 | 2277.99 | 0.18 | 0.68 | 1.63 | 1 | 1.63E+0 |
| Our proposed + RC | 1.09 | 489.48 | 0.04 | 0.28 | 0.30 | $2^8$ | 1.95E+1 | 1.70 | 817.99 | 0.06 | 0.34 | 0.58 | $2^{10}$ | 5.91E+2 |
| RNS + RC | 1.08 | 669.69 | 0.06 | 0.31 | 0.32 | 1 | 3.21E-1 | 2.01 | 1460.93 | 0.15 | 0.71 | 1.43 | 1 | 1.43E+0 |
| Bit-Width | 16-bit | | | | | | | 32-bit | | | | | | |
| Design Approach | CP (ns) | Area ($\mu m^2$) | Power @ 100MHz (mW) | Power @ Max Freq. (mW) | EPC (pJ) | # of Cycles | Energy @ Max Freq. (pJ) | CP (ns) | Area ($\mu m^2$) | Power @ 100MHz (mW) | Power @ Max Freq. (mW) | EPC (pJ) | # of Cycles | Energy @ Max Freq. (pJ) |
| Deterministic SC | 1.26 | 1922.26 | 0.13 | 0.89 | 1.12 | $2^{32}$ | 4.81E+9 | 1.93 | 3695.86 | 0.23 | 1.07 | 2.07 | $2^{64}$ | 2.21E+19 |
| Our proposed | 0.70 | 685.18 | 0.04 | 0.53 | 0.37 | $2^{12}$ | 1.52E+3 | 0.94 | 1322.02 | 0.08 | 0.78 | 0.66 | $2^{22}$ | 2.76E+6 |
| RNS | 1.23 | 1582.01 | 0.13 | 0.91 | 1.11 | 1 | 1.11E+0 | 1.99 | 4576.16 | 0.42 | 1.89 | 3.76 | 1 | 3.76E+0 |
| Binary | 4.06 | 4474.82 | 0.39 | 0.85 | 3.45 | 1 | 3.45E+0 | 7.59 | 11591.53 | 1.35 | 1.58 | 11.99 | 1 | 11.99E+0 |
| Our proposed + RC | 1.84 | 983.18 | 0.07 | 0.36 | 0.66 | $2^{12}$ | 2.72E+3 | 2.88 | 1796.48 | 0.16 | 0.57 | 1.65 | $2^{22}$ | 6.88E+6 |
| RNS + RC | 2.42 | 2131.10 | 0.22 | 0.87 | 2.11 | 1 | 2.22E+0 | 4.47 | 5612.83 | 0.62 | 1.72 | 7.69 | 1 | 7.69E+0 |

FIGURE 7

| Design Approach | CP (ns) | Area ($\mu m^2$) | Power @ 100MHz (mW) | Power @ Max Freq. (mW) | EPC (pJ) | # of Cycles | Energy @ Max Freq. (pJ) |
|---|---|---|---|---|---|---|---|
| Deterministic SC | 2.06 | 1922 | 0.15 | 0.62 | 1.28 | $2^{32}$ | 5.48E+9 |
| Our proposed | 0.83 | 1339 | 0.14 | 0.18 | 0.15 | $2^{12}$ | 6.12E+2 |
| RNS | 1.82 | 2802 | 0.17 | 0.85 | 1.54 | 1 | 1.54 |
| Binary | 5.43 | 8613 | 0.49 | 0.86 | 4.65 | 1 | 4.65 |

METHOD AND ARCHITECTURE FOR ACCELERATING DETERMINISTIC STOCHASTIC COMPUTING USING RESIDUE NUMBER SYSTEM

CROSS REFERENCE TO RELATED APPLICATIONS

This application claims priority to U.S. Provisional Application No. 62/969,872 titled "ACCELERATING DETERMINISTIC STOCHASTIC COMPUTING USING RESIDUE NUMBER SYSTEM", filed on Feb. 4, 2020.

STATEMENT REGARDING FEDERALLY SPONSORED RESEARCH OR DEVELOPMENT

Not applicable.

REFERENCE TO A "SEQUENCE LISTING", A TABLE, OR COMPUTER PROGRAM

Not applicable.

DESCRIPTION OF THE DRAWINGS

The drawings constitute a part of this specification and include exemplary examples of the METHOD AND ARCHITECTURE FOR ACCELERATING DETERMINISTIC STOCHASTIC COMPUTING USING RESIDUE NUMBER SYSTEM, which may take the form of multiple embodiments. It is to be understood that in some instances, various aspects of the invention may be shown exaggerated or enlarged to facilitate an understanding of the invention. Therefore, drawings may not be to scale.

FIG. 2 provides the clock cycle comparison of the disclosed architecture and deterministic methods currently known in the art.

FIG. 3 provides a chart of the required number of clock cycles required when multiplying two values with the disclosed architecture based on the $(2^m-3, 2^m-1, 2^m)$ moduli set verses the deterministic SC.

FIG. 5 provides a chart of the state transition of the proposed FSM-based RC, where $S_0$ is the initial state; x, y, and z show the output bit-streams of each computing lane at any cycles, and c is the current output of the Reverse Converter.

FIG. 6 provides a chart of the synthesis results for two-input multiplications in 45 nm technology, where the results are shown for different bit-widths of operands.

FIG. 7 provides a comparison chart of the critical path delay, area, power, and energy consumption of a processing element.

FIELD OF THE INVENTION

Figure 1A:
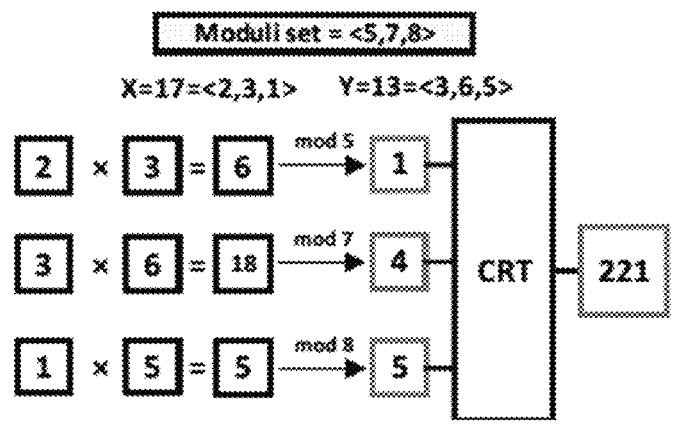
FIG. 1(a) provides a drawing of the known method of Residue Number System (RNS) multiplication.

The field of the invention is stochastic computing, specifically in the realms of unary processing and deterministic bit-stream computing.

BACKGROUND OF THE INVENTION

Stochastic computing (SC) is an unconventional computing paradigm processing bit-streams. High noise tolerance and lower hardware costs compared to conventional binary-radix-based designs are the most appealing advantages of SC. Inaccurate computations and long processing time, however, are significant drawbacks of conventional SC-based designs. Random fluctuations in generating bit-streams and correlation between bit-streams are the main sources of inaccuracy in the conventional SC. The common method to improve accuracy is to increase the length of the bit-streams. However, longer bit-streams means longer latency and higher energy consumption.

In SC, computation is performed on random or unary bit-streams. The ratio of the number of Is to the length of a bit-stream determines the value of the bit-stream. Complex arithmetic operations are implemented using simple logic gates in this paradigm. For example, an AND gate can be used to multiply two numbers in stochastic domain. With stochastic representation, a stream of $2^n$ bits can precisely represent any n-bit precision number. A number in binary format is conventionally converted to a stochastic bit-stream by comparing a pseudo-random or an increasing/decreasing number to the target number. The output of comparison generates one bit of the bit-stream at any cycle. A stochastic bit-stream can be converted back to the binary format by simply counting the number of ones in the bit-stream using a binary counter.

A requirement for performing operations such as multiplication in the stochastic domain is to convert the data into independent bit-streams. In conventional SC, this independence is provided by using different sources of random numbers in generating bit-streams. However, due to random fluctuations in generating random bit-streams and also correlation between bit-streams, the computations in conventional SC are not accurate.

Recently, some deterministic approaches to SC have been proposed to perform deterministic and completely accurate computations with SC circuits. See D. Jenson and M. Riedel, "A deterministic approach to stochastic computation", 2016 *IEEE ACM International Conference on Computer-Aided Design (ICCAD),*" IEEE (2016), 1-8; M. H. Najafi, S. Jamila-Zavareh, D. J. Lilja, M. D. Riedel, K. Bazargan, and R. Harjani, "Time-Encoded Values for Highly Efficient Stochastic Circuits," *IEEE Transactions on Very Large Scale Integration (VLSI) Systems,* vol. 25, no. 5 (May 2017), 1644-1657. In these methods, the required independence between bit-streams is provided through rotation of bit-streams, clock dividing bit-streams, or using bit-streams with relatively prime lengths. These methods guarantee that each bit of one operand (bit-stream) sees every bit of the other operands (bit-streams) exactly once, resulting in a deterministic and completely accurate computation. Said differently, the deterministic methods guarantee accurate computation if generating and processing bit-streams for the product of the length of the input bit-streams. For example, to multiply two n-bit precision data, each represented using a bit-stream of length $2^n$, the deterministic methods take $2^{2n}$ cycles to produce the exact result which is a bit-stream of $2^{2n}$ bit length. Although the deterministic methods outperform the conventional SC in terms of computation accuracy, the long processing time and consequently high energy consumption (power×time) limit their application.

Residue Number System (RNS) is a number representation system in which a number is represented by its residues to the members of a set of relatively prime integers (called moduli set). Formal definition of RNS can be written as follows: considering a set of L relatively prime numbers $<m_1, m_2, \ldots, m_L>$, an integer value x is represented by $<x_1, x_2, \ldots, x_L>$ where $x_i = x \bmod m_i$. An important advantage of using the RNS is that complex and costly operations can be split into several independent and simple operations running in parallel. For example, a 2-input multiplication (x×y) can be performed in three steps: (1) convert the two integer operands, x and y, to their RNS representation; (2) multiply each pair of $(x_i, y_i)$; (3) convert the multiplication result back to the weighted binary. This computation flow can also be extended to other arithmetic operations such as addition and subtraction. Considering the fact that the residues are significantly smaller than the original number, a set of significantly shorter bit-streams can be used to precisely represent each number.

An RNS system with moduli set $<m_1, m_2, \ldots, m_L>$ represents $DR = m_1 \times m_2 \times \ldots \times m_L$ different numbers. DR is called the dynamic range of the system. To represent an n-bit binary number, the dynamic range of the selected moduli set should be greater than $2^n$ to guarantee that all numbers in the range of $[0, 2^n-1]$ can be covered. For example, $<8,7,5>$ is a moduli set with a dynamic range equal to 280 that can be used to represent 8-bit precision weighted binary numbers.

For example, considering the moduli set $<8,7,5>$ and two operands x=17 and y=13, multiplication of these two operands can be performed as follows. x=17 is represented by $<2,3,1>$, where 2, 3, and 1 are the residues when dividing 17 by the modulus 5, 7 and 8, respectively. Also, y=13 is represented by $<3,6,5>$. A drawback of using the RNS can be seen in this example. Representing an 8-bit binary number using the RNS format requires 9 bits (each modulus needs 3 bits). The multiplication and addition operations are each divided into three simpler operations running in parallel. In multiplication of modulus $m_2=7, 3\times6=18$ is greater than 7 and hence the result must be changed to 4. So, the operation in each modulus must be performed using modular operators such that the result of the operation is within $[0, m_i]$. Converting the result in the RNS format to its corresponding weighted binary representation is difficult and one of the challenges with the RNS. Chinese Reminder Theorem is a solution for this and is a method to convert a number in the RNS format to its corresponding binary representation (reverse conversion).

SUMMARY OF THE INVENTION

Disclosed herein is a novel approach to improving the extended processing time of deterministic SC methods. This method integrates deterministic methods with the RNS to reduce the length of bit-streams exponentially. RNS offers a high degree of parallelism and modularity. In RNS, each number is decomposed into a set of residues that are smaller than the primary number. The arithmetic operations are performed on each residue independently and in parallel with the operations on other residues. This makes RNS a computation technique free of carry propagation. The parallelism offered by RNS distinguishes it from other number systems like Logarithmic Number System (LNS). The disclosed design outperforms prior designs on time and energy consumption. Synthesis results on implementation of multiplication operation show that the proposed approach reduces the hardware area and power consumption more than 88% and 56%, respectively, compared to those of the conventional 32-bit binary implementation.

The disclosed design presents several benefits and contributions. First, by integrating the deterministic methods of SC with RNS representation, the novel design provides a lower hardware area and power consumption compared to conventional binary and RNS implementation. Second, the disclosed design results in a significant reduction in the number of processing cycles (ratio of $2^{2*(n-\lceil \log_2 n \rceil)}$ where n is the data bit-width) compared to SC deterministic methods presently known in the art. Third, the disclosed design utilizes an FSM-based reverse converter (RC) to directly covert the RNS-based bit-streams to binary numbers. Finally, the disclosed approach as compared to known processing elements for convolutional neural networks shows 84%, 52%, and 30% area reduction, respectively, compared to baselines binary, RNS, and clock division deterministic implementation. These features make the disclosed architecture an attractive alternative to the deterministic designs of SC known in the art of resource-limited applications.

DETAILED DESCRIPTION OF THE INVENTION

In the deterministic methods, the number of clock cycles required to perform an operation follows an exponential function of the binary bit-width of the operands. Multiplying two n-bit precision data takes $2^{2n}$ clock cycles as $2^{2n}$-bit bit-streams must be processed. Using high-bit-width binary numbers as the operands of the operations leads to very long processing time and consequentially energy consumption. By exploiting the parallel nature of the RNS, the high-bit-width operands of the computations can be split into operands (residues) with low bit-width. While the idea is presented based on the multiplication operation, the disclosed methodology is also applicable to the deterministic scaled addition/subtraction.

Figure 1B:
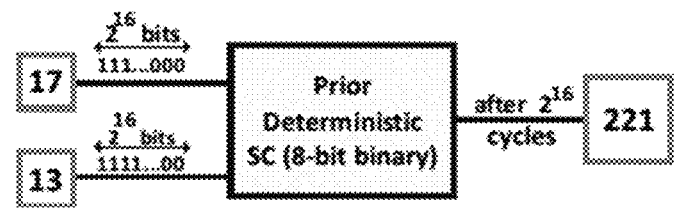
FIG. 1(b) provides a drawing of the known method of deterministic stochastic computing.
Figure 1C:
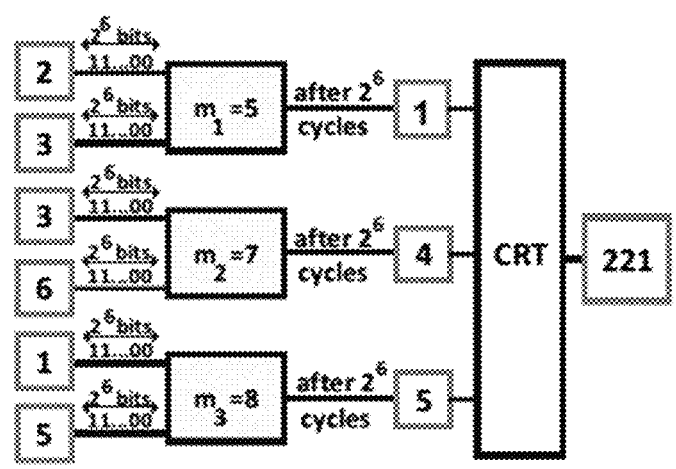
FIG. 1(c) provides a drawing of the disclosed RNS-based deterministic method.

Precise SC in RNS Domain. Dividing the computation into several parallel lanes, each lane processing low bit-width operands, decreases the complexity of the computation. Decreasing the bit-width of the operands means exponentially shorter bit-streams to represent each data. FIG. 1 illustrates the idea of combining the deterministic methods of SC and RNS through a simple example. As shown in FIG. 1(b), multiplying two 8-bit precision numbers with the deterministic methods takes $2^{2\times 8}$ clock cycles. FIG. 1(c) shows how the disclosed method reduces the number of processing cycles. With RNS, the precision of the operands decreases to three bits. Hence, it only takes $2^{2\times 3}$ clock cycles to perform all sub-computations, which means $2^{10}\times$ fewer cycles compared to the non-RNS design. Note that the proposed RNS-backed design has some hardware cost overheads to convert the outputs back from RNS to the binary format. In many applications, the conversion can be postponed to the final stage of computation. Even with the conversion overhead, the disclosed design provides a higher energy efficiency compared to known designs in the art.

Moduli Set Selection. FIG. 2 compares the processing time of the disclosed design and the deterministic designs for different data precisions and moduli sets. As can be seen in FIG. 2, the performance improvement offered by the proposed design changes by changing the moduli set (both the number of moduli and the value of each modulus). So, choosing a proper moduli set is an important step to achieve the best performance using the proposed technique.

Symmetricity of the design is also considered. In conventional RNS, circuits for each operation in different moduli have different timing characteristics. For instance, the critical path (CP) delay of a modular multiplier in mode $2^n$ is much lower than the CP delay for a modular multiplier in mode $2^n-1$. Typically, there are more than two moduli in a moduli set. The difference between the CP of the fastest and the slowest moduli is considerable. The slowest modulus determines the overall system's speed. In our proposed method, the CP delay depends on the binary precision (bit-width) of the moduli; the modulus with the same bit-width have the same CP delay and the modulus with different bit-widths have different CP delays. For example, in the moduli set (64; 63; 61; 59; 5), circuits for moduli 64, 63, 61, and 59 have the same CP delay which is different to the CP delay of the circuit for modulus 5. Another concern is the number of required clock cycles to complete the computations. In the moduli set (64; 63; 61; 59; 5), the result of modulus 5 is ready after $2^{2\times 3}$ cycles, while the results of other moduli are ready after $2^{2\times 6}$ cycles. Thus, some parts of the circuit are underutilized for a large fraction of processing time. To avoid this type of inefficiency, a moduli set where all the modulus having the same bit-width is selected and thus take the same number of processing cycles.

In one embodiment, the following moduli set is selected with three members: ($2^m-3$, $2^m-1$, $2^m$). These numbers are the three greatest relatively prime numbers represented by m bits. The residues of dividing any integer number by these three moduli can be represented by the same number of bits (i.e., m bits). It is easy to prove that the inequality in Eq. (1) is true for any m>2. The inequality shows that these three numbers can represent any $n=2^{3m-1}$-bit precision binary number. For example, with m=3, the resulted RNS can represent any 8-bit precision binary number.

$$(2^m-3)\times(2^m-1)\times(2^m) \geq 2^{3m-1} \quad\quad \text{Equation (1)}$$

Proof: consider $2^m$=X. The above equation can be rewritten as follows:

$$(X-3)\times(X-1) \geq \frac{X^2}{2}$$

which will hold when X≥8. So, for m≥3, Equation (1) is always true. For example, assuming A is a 9-bit binary number with the moduli set ($2^m-3$, $2^m-1$, $2^m$), the smallest bit-width for RNS representation of A is given by 3m−1≥9. The smallest integer number that satisfies this inequality is 4.

FIG. 3 compares the number of processing cycles for the case of multiplying two binary numbers with the proposed design when using ($2^m-3$, $2^m-1$, $2^m$) as the moduli set, and with the current deterministic methods of SC. Multiplying two n-bit precision data with the deterministic methods takes $2^{2n}$ cycles. The reduction ratio (the number of cycles with the deterministic methods divided by the number of cycles with the proposed method) is formulated as follows:

$$\text{reduction}_{ratio}=2^{2*(n-\lceil log2\ n\rceil)}$$

As can be seen in FIG. 3, the reduction ratio increases by increasing the data bit-width which means higher savings in the processing time and energy consumption. It should be noted that the selected moduli set is not efficient for processing of low bit-width operands, e.g. for n≤8. For processing of such operands other modules sets such as ($2^m-1$, $2^m$) is recommended.

Figure 4A:
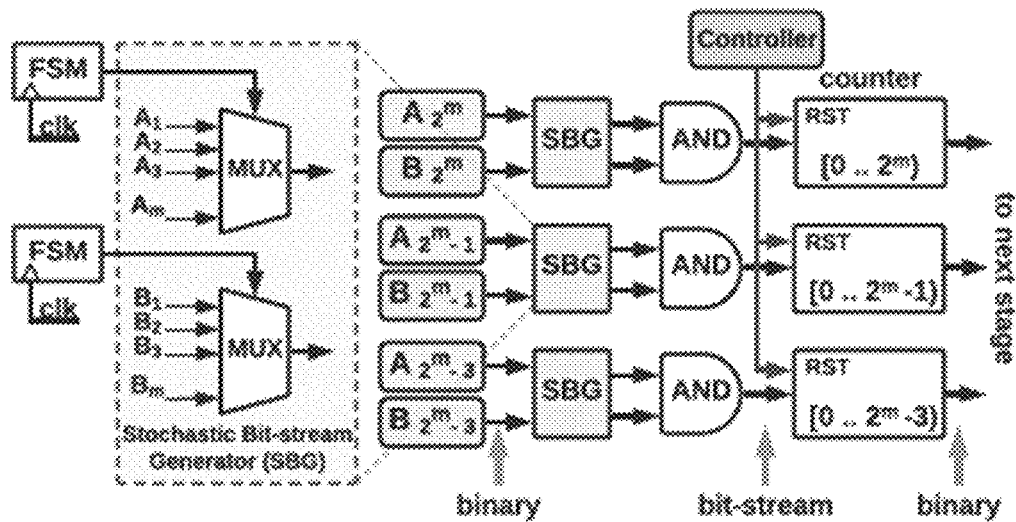
FIG. 4(a) provides a logic diagram of one embodiment of the disclosed architecture for the multiplication operation intermediate stages without reverse conversion.
Figure 4B:
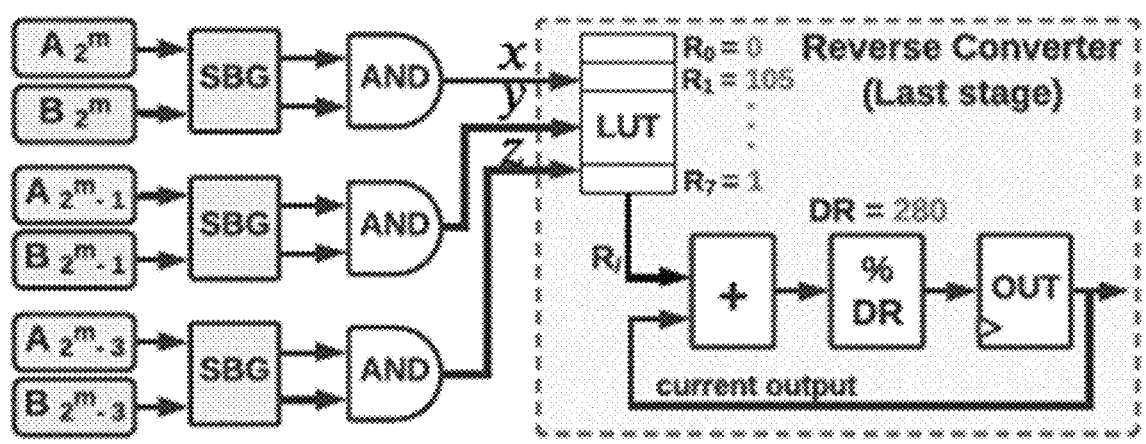
FIG. 4(b) provides a logic diagram of one embodiment of the disclosed architecture for the multiplication operation last stage with the Reverse Converter (RC).

Hardware. FIGS. 4(a) and 4(b) demonstrate the high-level architecture for n-bit precision multiplication. The moduli set is ($2^m-3$, $2^m-1$, $2^m$). An input buffer is used to store two distinct numbers, A and B, in the RNS format. These two numbers are provided as the inputs of the circuit, each using three residues, i.e., $A_{2^m}$, $A_{2^m-1}$, and $A_{2^m-3}$. The architecture utilizes a low-cost FSM-based bit-stream generator to convert the residues to bit-stream representation. Converting each residue requires a separate multiplexer (MUX) unit. Two FSMs are reused and connected to the selected input of the MUX units to choose one of the binary bits of residue at any cycle. To guarantee the required independence between the two inputs of each multiplication operation, each one of the two FSMs is configured to generate a different low discrepancy pattern. Each FSM is connected to three MUX units, each MUX for converting one of the three residues. In cases that the architecture is extended to perform several multiplications in parallel, the two FSMs will be shared between more multipliers and the effective overhead will be lower.

As shown in FIG. 4(a), three parallel AND gates are employed to perform the multiplication operations on the residues. Each AND gate is followed by a counter to convert the produced output bit-stream to binary representation. To calculate the residues of the outputs, the reset signal of each counter is set to corresponding modulus. The state of the counters also plays a register role to store the final results. The controller manages other aspects of the system for correct operation. In contrast with conventional SC designs where the streaming inputs can be processed partially, the disclosed design processes entire bit-streams to accurately perform RNS computations.

Reverse Conversion. In applications where we have several consecutive stages of operations in a pipelined fashion, there is no need to convert the RNS numbers back to binary format in the intermediate stages. In fact, all the intermediate computations can be performed in the RNS domain and the RNS-to-binary conversion will be confine to the last stage of the computations. A naive method to perform this reverse conversion is by using a Chinese Remainder Theorem (CRT) module. The CRT module receives the residue numbers from the counters and converts them to the equivalent representation in the binary domain. However, CRT requires a high-power logic circuit which reduces the effectiveness of the RNS method. Here disclosed is an efficient FSM-based Reverse Converter (RC) to directly convert the residue bit-streams to binary representation. Since the inputs of the proposed RC are RNS-based numbers in the bit-stream format, the counters can be removed from the last stage.

FIG. 5 provides a chart of the transitions of the proposed RC. The FSM has DR states, entitled 0 to DR−1. The converted result (output) is equal to the final state's number after iterating over all input bit-streams. In FIG. 5, Sc represents the current state, % shows the Mod operation, and $R_i$ shows the reversed binary equivalent of the converter's input vector, where i is the integer value of the input vector. Since our moduli set has three moduli, the array R is of size $2^3$=8 which is independent of m. For instance, $R_1$=105 is the only number in the dynamic range whose remainders of division by $2^3-3$, $2^3-1$, and $2^3$ are equal to 0, 0, and 1, respectively. Similarly, given m=3, DR=($2^3-3$)×($2^3-1$)×($2^3$) =280, and R={0, 105, 120, 225, 56, 161, 176, 1} can be calculated and stored in a look-up table at design time. FIG.

4(b) shows the equivalent hardware needed for reverse conversion. The output register is initialized to zero, hence the initial state in the transition table is $S_0$. In each cycle, the RC unit chooses one of the stored values in the LUT based on its input values, and calculates the next state (output). Note that the forward conversion (binary-to-RNS conversion) can be done in the proposed design in an offline manner at no additional hardware cost.

Experimental Results. To evaluate the performance of the architecture, here implemented is a two-input multiplier with various bit-widths by 1) the disclosed design, 2) conventional binary design, 3) conventional RNS, and 4) clock division deterministic design. We also evaluate the hardware efficiency of the multiplier when using the proposed design with the FSM-based RC compared to an RNS-based design that uses known RC methods. The conventional nondeterministic SC is not compared due to its inability to produce accurate results and its significantly higher latency and energy consumption compared to the deterministic methods of SC. The conventional RNS design is implemented based on ($2^m-1$, $2^m$, $2^m+1$) moduli set as it provides the minimum hardware cost. The cost of implementing a processing element in a state-of-the-art convolutional neural network accelerator is also compared based on binary, RNS, and proposed design methodology. The hardware efficiency of the architecture was evaluated using a cycle-accurate micro-architectural simulator in RTL VHDL, and Synopsys Design Compiler synthesizes the implemented designs with the 45 nm FreePDK gate library. The disclosed architecture delivers the same computation accuracy and the same result as the baseline binary and RNS designs.

Hardware Costs for Multiplication Operation. For each design approach, 8-, 12-, 16-, and 32-bit multipliers are implemented. FIG. 6 shows the CP delay, hardware area, power consumption at 100 MHz and at the maximum working frequency, energy per cycle (EPC=CP×power consumption at the maximum working frequency), number of clock cycles to complete the computation, and total energy consumption (EPC×number of clock cycles) of the implemented designs. The disclosed architecture offers, on average, 79% and 49% saving in the hardware area cost and 84% and 57% reduction in the EPC compared to the binary and non-stochastic RNS counterpart, respectively. Considering the fact that the total energy of the SC designs depends on the number of processing cycles, the binary and RNS designs consume lower energy to produce accurate results.

Compared to the clock division deterministic designs known in the art, the proposed RNS-based design requires less hardware resources to generate bit-streams (counters and comparators are replaced with FSMs and MUXs), and to convert the output bit-streams back to the binary format. For example, for the 16-bit multiplication, the proposed design requires three 6-bit counters in its output while the clock division design needs a 32-bit counter. On average, the disclosed architecture saves the area and power consumption by 63.5% and 32.5%, respectively, compared to the clock division design. The hardware cost of the proposed design with and without RC is reported in FIG. 6. The rows with "+RC" are the ones that include the RC circuit. As it can be seen, even with RC the primary saving is still observed in the processing time and energy consumption. The proposed design delivers more than 2400 times speedup and 3200 times energy reduction for 8-bit precision multiplication. For 32-bit precision multiplication, the latency and energy consumption reduce by a factor of $9.03 \times 10^{12}$ and $1.38 \times 10^{13}$, respectively.

Hardware Costs for Neural Network Computations. Due to the increase in the use of neural networks (NNs) in all field of science, designing NN accelerators is an important task. To further evaluate the proposed design, a known processing element (PE) is implemented with different design approaches. Only the computational and the logical parts of the PE are implemented and we do not take scratchpads into account. The design is evaluated for 16-bit precision data-width. FIG. 7 shows the synthesis results. As it can be seen, the proposed design occupies 84% lower area compared to the binary implementation. It also needs 52% lower area compared to the non-stochastic RNS implementation. The proposed design achieves $2.6 \times 10^6$ and $8.94 \times 10^6$ times reduction in terms of processing time and energy consumption, respectively, compared to the conventional deterministic design of SC.

The product of power consumption, CP delay, and occupied area can be used as a measure of hardware efficiency. Based on this metric, the proposed design is 201 and 21.5 times more efficient than the conventional binary and RNS design, respectfully. It should be noted for the processing time and also total energy consumption, the conventional binary implementation still outperforms SC-based designs when performing a completely accurate computation. The proposed design is a good fit for embedded applications with severe limitations on the area and power consumption but not very efficient for high-performance and energy-limited applications.

The subject matter of the present invention is described with specificity herein to meet statutory requirements. However, the description itself is not intended to necessarily limit the scope of claims. Rather, the claimed subject matter might be embodied in other ways to include different steps or combinations of steps similar to the ones described in this document, in conjunction with other present or future technologies.

Although the terms "step" and/or "block" or "module" etc. might be used herein to connote different components of methods or systems employed, the terms should not be interpreted as implying any particular order among or between various steps herein disclosed unless and except when the order of individual steps is explicitly described.

Furthermore, the described features, structures, or characteristics may be combined in any suitable manner in one or more embodiments. Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment. Moreover, the terms "substantially" or "approximately" as used herein may be applied to modify any quantitative representation that could permissibly vary without resulting in a change to the basic function to which it is related.

We claim:

1. An architecture for performing bit-stream processing, comprising:
   (a) at least one finite state machine;
   (b) at least one bit-stream generator;
   (c) a moduli set;
   (d) at least one input buffer, which stores at least two numbers;
   (e) at least one counter;
   (f) at least one AND gate;
   (g) a controller; and (h) at least one multiplexer unit;
wherein the stored at least two numbers comprise three residues;
wherein the finite state machines are connected an input of at least one or more multiplexer units;
wherein the stored at least two numbers function as inputs for the architecture;
wherein the stored at least two numbers are stored in Residue Number System format; and
wherein the at least one bit-stream generator comprises coding capable of converting one or more residues of the at least two numbers to bit-stream representation.

2. The architecture of claim 1, further comprising two or more multiplexer units.

3. The architecture of claim 1, further comprising at least one multiplexer for each residue to be converted.

4. The architecture of claim 1, further comprising at least one additional finite state machine, and wherein the finite state machines are configured to generate different low-discrepancy patterns.

5. The architecture of claim 1, wherein the stored at least two numbers comprise three residues, and further comprising three parallel AND gates where each AND gate is connected to at least one bit-stream generator.

6. The architecture of claim 1, wherein each of the at least one AND gate is connected to one of the at least one counter.

7. The architecture of claim 1, wherein the at least one counter stores one or more results of the bit-stream processing.

8. The architecture of claim 1, further comprising a Reverse Converter.

9. The architecture of claim 1, further comprising a Reverse Converter comprising a Look-Up Table.

10. A method for performing bit-stream processing, comprising:
storing at least two distinct numbers in an input buffer wherein each distinct number comprises two or more residues;
inputting the at least two distinct numbers into an at least one finite state machine-based bit-stream generator;
generating one or more deterministic bit-streams by the at least one bit-stream generator, wherein each residue conversion comprises use of a separate multiplexer unit;
performing multiplication of one or more outputs of the at least one bit-stream generator using an AND gate to produce a bit-stream;
converting the produced bit-stream to binary representation using a counter; and
calculating any residues.

11. The method of claim 10, wherein the at least two distinct numbers are stored in Residue Number System format.

12. The method of claim 10, wherein the converting the produced bit-stream to weighted binary format occurs last.

13. The method of claim 10, wherein the produced bit-stream is converted to binary representation through the counter counting how many 1s are found in the produced bit-stream.

14. The method of claim 10, further comprising converting the produced bit-stream to weighted binary format.

* * * * *